United States Patent
Tsutsui et al.

(10) Patent No.: US 9,299,955 B2
(45) Date of Patent: Mar. 29, 2016

(54) SELF LIGHT-EMITTING DEVICE

(71) Applicant: Semiconductor Energy Laboratory Co., Ltd., Kanagawa-ken (JP)

(72) Inventors: Tetsuo Tsutsui, Fukuoka (JP); Toshimitsu Konuma, Kanagawa (JP); Mayumi Mizukami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/619,530

(22) Filed: Feb. 11, 2015

(65) Prior Publication Data

US 2015/0162567 A1 Jun. 11, 2015

Related U.S. Application Data

(63) Continuation of application No. 13/366,838, filed on Feb. 6, 2012, now Pat. No. 8,957,584, which is a continuation of application No. 11/501,314, filed on Aug. 9, 2006, now Pat. No. 8,110,983, which is a continuation of application No. 11/021,070, filed on Dec. 22, 2004, now Pat. No. 7,317,282, which is a continuation of application No. 09/696,619, filed on Oct. 25, 2000, now Pat. No. 6,847,163.

(30) Foreign Application Priority Data

Oct. 29, 1999 (JP) .................................. 11-307903

(51) Int. Cl.
*H01L 51/52* (2006.01)
*H01L 51/50* (2006.01)
(Continued)

(52) U.S. Cl.
CPC ........ *H01L 51/5275* (2013.01); *H01L 27/3248* (2013.01); *H01L 51/5012* (2013.01); *H01L 51/525* (2013.01); *H01L 51/5206* (2013.01); *H01L 51/5221* (2013.01); *H01L 51/5262* (2013.01); *H01L 51/5271* (2013.01); *G02F 1/133602* (2013.01); *H01L 51/0037* (2013.01);
(Continued)

(58) Field of Classification Search
CPC .................. H01L 51/5275; H01L 27/3248
See application file for complete search history.

(56) References Cited

U.S. PATENT DOCUMENTS

| 4,653,864 A | 3/1987 | Baron et al. |
| 4,829,213 A | 5/1989 | Pecile et al. |

(Continued)

FOREIGN PATENT DOCUMENTS

| EP | 0 809 420 A1 | 11/1997 |
| EP | 0 859 539 A2 | 8/1998 |

(Continued)

OTHER PUBLICATIONS

Kim, H.H. et al., "Silicon Compatible Organic Light Emitting Diode," Journal of Lightwave Technology, Dec. 1, 1994, vol. 12, No. 12, pp. 2107-2113.

(Continued)

*Primary Examiner* — Elmito Breval
(74) *Attorney, Agent, or Firm* — Husch Blackwell LLP

(57) ABSTRACT

To provide a method of improving an efficiency for extracting light in a self light-emitting device using an organic EL material. In the self light-emitting device having a structure in which an EL layer (102) is sandwiched between a transparent electrode (103) and a cathode (101), a film thickness of the EL layer (102) and a film thickness of the transparent electrode (102) are equivalent to the film thicknesses in which there is no occurrence of a guided light, and an inert gas is filled in a space between the transparent electrode (103) and a cover material (105).

8 Claims, 5 Drawing Sheets

(51) Int. Cl.
*H01L 27/32* (2006.01)
*G02F 1/1335* (2006.01)
*H01L 51/00* (2006.01)

(52) U.S. Cl.
CPC ......... *H01L 51/0091* (2013.01); *H01L 51/5088* (2013.01); *H01L 51/5092* (2013.01); *H01L 2251/558* (2013.01)

(56) References Cited

U.S. PATENT DOCUMENTS

| | | | |
|---|---|---|---|
| 4,954,746 | A | 9/1990 | Taniguchi et al. |
| 5,059,148 | A | 10/1991 | McKenna et al. |
| 5,427,858 | A | 6/1995 | Nakamura et al. |
| 5,589,732 | A | 12/1996 | Okibayashi et al. |
| 5,632,663 | A | 5/1997 | Ishihara et al. |
| 5,640,067 | A | 6/1997 | Yamauchi et al. |
| 5,742,129 | A | 4/1998 | Nagayama et al. |
| 5,864,206 | A | 1/1999 | Ishihara et al. |
| 5,869,929 | A | 2/1999 | Eida et al. |
| 5,876,106 | A | 3/1999 | Kordecki |
| 5,883,465 | A | 3/1999 | Inoguchi et al. |
| 5,891,554 | A | 4/1999 | Hosokawa et al. |
| 5,909,081 | A | 6/1999 | Eida et al. |
| 5,958,610 | A | 9/1999 | Yonekawa et al. |
| 5,965,981 | A | 10/1999 | Inoguchi et al. |
| 5,998,926 | A | 12/1999 | Tsuruoka et al. |
| 6,023,073 | A | 2/2000 | Strite |
| 6,025,894 | A | 2/2000 | Shirasaki et al. |
| 6,049,167 | A | 4/2000 | Onitsuka et al. |
| 6,091,078 | A | 7/2000 | Codama |
| 6,091,194 | A | 7/2000 | Swirbel et al. |
| 6,111,355 | A | 8/2000 | Inoue et al. |
| 6,137,459 | A | 10/2000 | Eida et al. |
| 6,147,451 | A | 11/2000 | Shibata et al. |
| 6,160,273 | A | 12/2000 | Fork et al. |
| 6,163,110 | A | 12/2000 | Arai |
| 6,175,186 | B1 | 1/2001 | Matsuura et al. |
| 6,246,179 | B1 | 6/2001 | Yamada |
| 6,262,531 | B1 | 7/2001 | Inoguchi et al. |
| 6,265,820 | B1 | 7/2001 | Ghosh et al. |
| 6,268,071 | B1 | 7/2001 | Yasukawa et al. |
| 6,366,017 | B1 | 4/2002 | Antoniadis et al. |
| 6,392,340 | B2 | 5/2002 | Yoneda et al. |
| 6,465,268 | B2 | 10/2002 | Hirakata et al. |
| 6,498,428 | B1 | 12/2002 | Matsuura et al. |
| 6,580,214 | B2 | 6/2003 | Yoneda et al. |
| 6,635,989 | B1 | 10/2003 | Nilsson et al. |
| 6,743,650 | B2 | 6/2004 | Hirakata et al. |
| 6,833,668 | B1 | 12/2004 | Yamada et al. |
| 6,847,163 | B1 | 1/2005 | Tsutsui et al. |
| 6,888,308 | B1 | 5/2005 | Guenther |
| 7,312,572 | B2 | 12/2007 | Yamauchi et al. |
| 7,821,200 | B2 | 10/2010 | Yamauchi et al. |
| 8,405,594 | B2 | 3/2013 | Yamauchi et al. |
| 2013/0175536 | A1 | 7/2013 | Yamauchi et al. |

FOREIGN PATENT DOCUMENTS

| | | |
|---|---|---|
| EP | 0 884 930 A1 | 12/1998 |
| EP | 0 899 987 A1 | 3/1999 |
| EP | 1 773 103 A2 | 4/2007 |
| GB | 2 321 781 A | 8/1998 |
| JP | 05-094879 A | 4/1993 |
| JP | 08-222369 A | 8/1996 |
| JP | 10-162952 A | 6/1998 |
| JP | 10-255978 A | 9/1998 |
| JP | 10-289784 A | 10/1998 |
| JP | 11-067457 A | 3/1999 |
| JP | 11-074072 A | 3/1999 |
| JP | 11-185955 A | 7/1999 |
| JP | 11-214152 A | 8/1999 |
| JP | 11-251059 A | 9/1999 |
| JP | 11-260546 A | 9/1999 |
| KR | 1998-0024347 A | 7/1998 |
| WO | WO 97/31508 A1 | 8/1997 |

OTHER PUBLICATIONS

Bulovic, V. et al., "Transparent Light-Emitting Devices," Nature, Mar. 7, 1996, vol. 380, p. 29.

Gu, G. et al., "Transparent Organic Light Emitting Devices," Applied Physics Letters, May 6, 1996, vol. 68, No. 19, pp. 2606-2608.

Gu, G. et al., "High-External-Quantum-Efficiency Organic Light-Emitting Devices," Optics Letters, Mar. 15, 1997, vol. 22, No. 6, pp. 396-398.

Bulovic, V. et al., "A Surface-Emitting Vacuum-Deposited Organic Light Emitting Device," Applied Physics Letters, Jun. 2, 1997, vol. 70, No. 22, pp. 2954-2956.

Bulovic, V. et al., "Weak Microcavity Effects in Organic Light-Emitting Devices," Physical Review. B, Aug. 15, 1998, vol. 58, No. 7, pp. 3730-3740.

Gu, G. et al., "High-Efficiency,Low-Drive-Voltage,Semitransparent Stacked Organic Light-Emitting Device," Applied Physics Letters, Oct. 26, 1998, vol. 73, No. 17, pp. 2399-2401.

Gu, G. et al., "A Metal-Free, Full-Color Stacked Organic Light-Emitting Device," Applied Physics Letters, Jan. 11, 1999, vol. 74, No. 2, pp. 305-307.

European Search Report re Application No. EP 123568.8, dated Dec. 2, 2003.

European Office Action re Application No. EP 00123568.8, dated Aug. 23, 2006.

Parthasarathy, G. et al., "A Metal-Free Cathode for Organic Semiconductor Devices," Applied Physics Letters, Apr. 27, 1998, vol. 72, No. 17, pp. 2138-2140.

SELF LIGHT-EMITTING DEVICE

This application is a continuation of copending U.S. application Ser. No. 13/366,838 filed on Feb. 6, 2012 which is a continuation of U.S. application Ser. No. 11/501,314 filed on Aug. 9, 2006 (now U.S. Pat. No. 8,110,983 issued Feb. 7, 2012) which is a continuation of U.S. application Ser. No. 11/021,070, filed on Dec. 22, 2004 (now U.S. Pat. No. 7,317,282 issued Jan. 8, 2008) which is a continuation of U.S. application Ser. No. 09/696,619, filed on Oct. 25, 2000 (now U.S. Pat. No. 6,847,163 issued Jan. 25, 2005), which are all incorporated herein by reference.

BACKGROUND OF THE INVENTION

1. Field of the Invention

The present invention relates to a self light-emitting device including an EL element, which is formed on a substrate, and comprises an opaque electrode (cathode), a transparent electrode (anode), and a luminescing organic material (hereinafter referred to as an organic EL material) sandwiched therebetween. Specifically, the present invention relates to an improvement of efficiency for extracting light from the EL element.

2. Description of the Related Art

In recent years, developments of EL display devices employing as an element an organic EL material are advancing. This is a current driving type self light-emitting device utilizing light emitting, which is caused by re-coupling of an electron and a hole injected into an organic thin film from the electrodes of both surfaces by applying a voltage. The light emitted is extracted as a sheet luminescent. However, the efficiency of extracting light, generated in a solid-state thin film having a large refractive index, to outside of the light-emitting element as a sheet luminescent is extremely low, normally 20% or less.

As shown in FIG. 2, among the lights outputted from a light source "A" in an "a" layer 202 having a large refractive index ($n=n_1$) to "b" layers 201 and 203 having small refractive indexes ($n=n_2$), the light entering at angles ($\theta_1$ and $\theta_2$) greater than the radiation angle of $\theta_0$ (provided that $\theta_0=\sin^{-1}(n_2/n_1)$) is entirely reflected and is waveguided in the "a" layer with a large refractive index. Thus, light that is waveguided is referred as a guided light. A part of the components of the guided light light is absorbed and disappears while the rest is propagated in the "a" layer 202 and escapes to the edge surface. Therefore, only a portion of the outgoing light can be extracted as a sheet luminescent.

SUMMARY OF THE INVENTION

The present invention has been made in view of the above stated problem, and therefore it is an object of the present invention to improve the efficiency of extracting light in a luminescent element, particularly, an EL element. Further, another object of the present invention is to provide a self light-emitting device having a high luminescing efficiency.

In the structure of the self-light emitting device of the present invention, as shown in FIG. 1, each of an EL layer 102 and a transparent electrode 103 contained in an EL element is formed so as to have a thickness in which a guided light does not occur, and an inert gas is filled between the transparent electrode and a cover material 105 (a region denoted by the reference numeral 104). Note that the region denoted by the reference numeral 104 is referred to as a "gas space" throughout the present specification.

Throughout the present specification, an EL element is an element whose structure is composed of a cathode made of an opaque electrode, an anode made of a transparent electrode, and an EL layer sandwiched therebetween. In the present invention, the cathode is the opaque electrode (light shielding electrode) and the anode is the transparent electrode. Further, it is to be noted that a layer where the injection, transportation, and re-coupling of carriers are performed is referred to as the EL layer throughout the present specification.

Furthermore, the film thickness in which there is no occurrence of a guided light is referred to as a film thickness (d) derived from $d \leq \lambda/(4n)$, where the refractive index of the film is n and the wavelength of the light generated in the EL element is $\lambda$. For instance, if the wavelength of the light generated in the EL element is 560 nm and the refractive index of the film is $n_x$, then $d \leq (140/n_x)$. Therefore, there is no existence of a guided light in a film having a film thickness that is thinner than the film thickness (d). Note that it is appropriate to set the total film thickness to $(140/n_x)$ or less when the refractive indexes of both the film for constituting the EL layer and the transparent electrode are $n_x$.

Next, an explanation will be made regarding the structure in which an inert gas is filled into the space between the transparent electrode and the cover material. It is generally known that when light travels through a gas space, a solid-state layer, and a gas space again in that order, the light can be extracted efficiently. Therefore, the structure is formed such that light generated in the EL element travels through the gas space, the solid-state layer, and the gas space in that order after it has transmitted the transparent electrode, thereby making it possible to improve the efficiency of extracting light. In the present invention, the structure of the EL element is a structure in which the inert gas is sandwiched between the transparent electrode and the cover material, and thus by forming the above stated structure, light can be extracted efficiently.

When employing the EL element having the structure shown in FIG. 1, it is desirable to provide a buffer layer between the EL layer 102 comprising only a light-emitting layer and the transparent electrode 103, or between the EL layer 102 made of only a light-emitting layer and the opaque electrode. It is to be noted that the buffer layer indicates a layer for promoting the injection and transportation of carriers (electrons or holes). In other words, an electron injection layer, a hole injection layer, an electron transporting layer, or a hole transporting layer may be utilized as the buffer layer. In the case of providing a buffer layer, the buffer layer is contained in the EL layer throughout the present specification.

The provision of the buffer layer improves the state of interface between the light-emitting layer and the electrode, and therefore the efficiency of extracting light generated in the light-emitting layer is improved. In the case of providing a buffer layer in the EL element with the structure of FIG. 1 of the present invention, the luminescing efficiency is further enhanced. Moreover, a problem of damaging the light-emitting layer during forming the transparent electrode thereon can be resolved by forming the buffer layer sandwiched between the light-emitting layer and the transparent electrode.

Thus, in the present invention, the film thicknesses of the respective layers forming the EL layer 102 and the film thickness of the transparent electrode, which are included in the EL element, are film thicknesses in which there is no occurrence of a guided light, and there is inert gas in the space between the transparent electrode and the cover material 105, thereby making it possible to largely increase the efficiency of extracting light. In addition, by providing the buffer layers between the electrodes that sandwich the light-emitting layer and the light-emitting layer within the EL element to form the EL layer made of the light-emitting layer and the buffer layers, the efficiency of extracting light can further be improved.

DETAILED DESCRIPTION OF THE PREFERRED EMBODIMENTS

Figure 1:
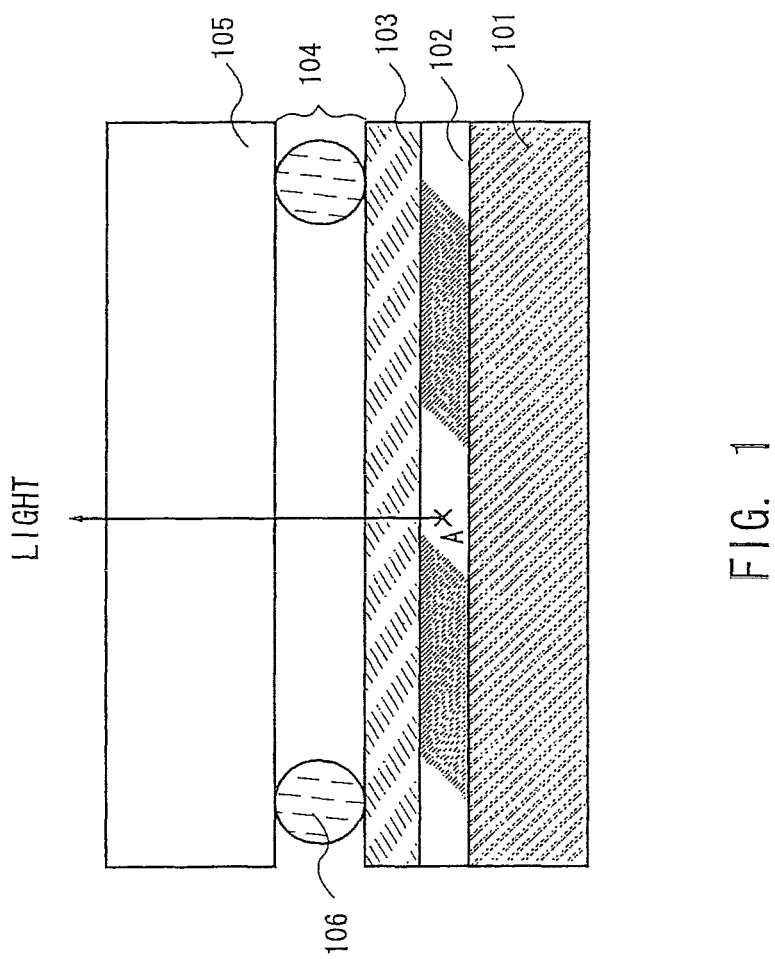
FIG. 1 is a diagram showing a structure of a self light-emitting device of the present invention.
Figure 2:
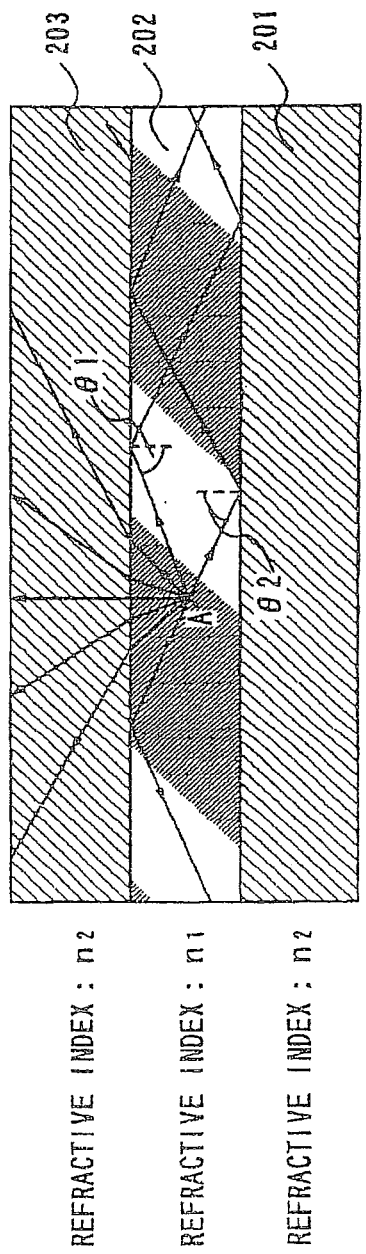
FIG. 2 is a diagram showing the state of generating a guided light.

In the present invention, as shown in FIG. 1, an EL element has a structure wherein an EL layer 102 and a transparent electrode 103 contained therein is formed so as to have a film thickness where there is no occurrence of a guided light, respectively, and a gas space 104 is formed sandwiched between the transparent electrode 103 and a cover material 105, and spacers 106 are utilized in the gas space 104 to secure it. To give an actual example, the film thickness of the EL layer 102 is set to 30 nm and the film thickness of the transparent electrode 103 is set to 100 nm.

A polymer-based organic EL material or a monomer-based organic EL material is used for the EL layer 102. The polymer-based organic EL material can be dissolved in a solvent in the polymer state and then applied, or it can be dissolved in a solvent in the monomer state and then polymerized after it has been applied.

Note that the gas space 104 refers to the space filled with the inert gas (typically argon, nitrogen, neon, and krypton). The cover material 105 indicates a transparent member, and specifically, glass, quartz, plastic, etc. can be used.

Figure 3:
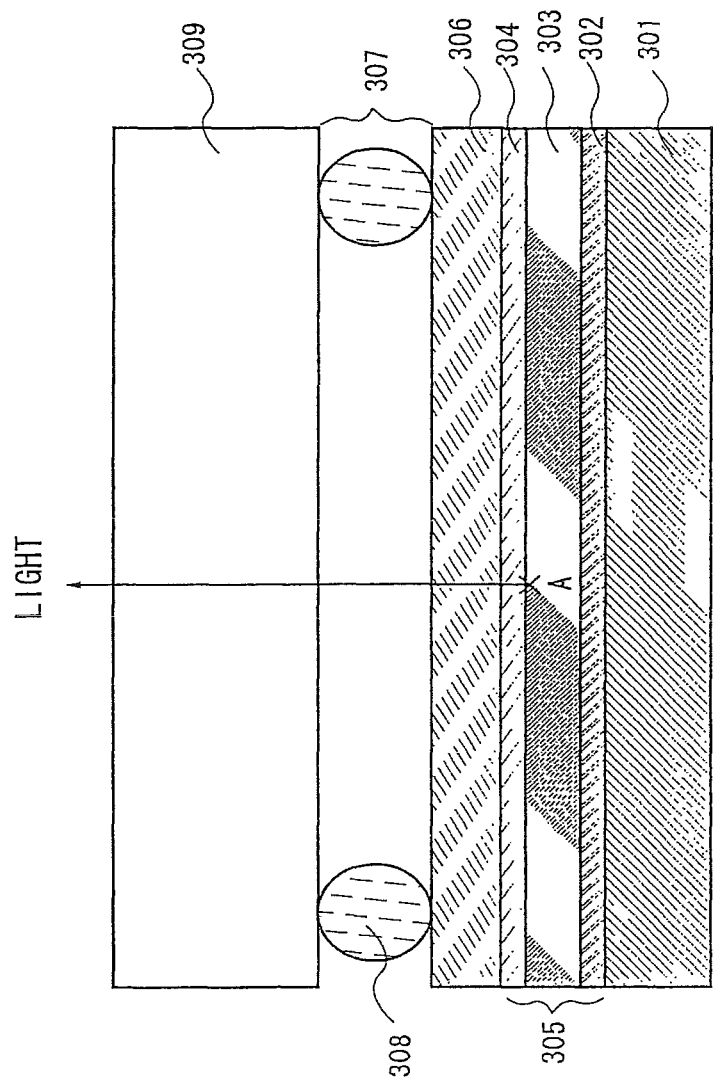
FIG. 3 is a diagram showing a structure of a self light-emitting device of the present invention.

Further, in order to improve the interface state in the transparent electrode and the EL layer comprising only a light-emitting layer, as shown in FIG. 3, the structure has buffer layers 302 and 304 sandwiched between a light-emitting layer 303 and a transparent electrode 306, and between the light-emitting layer 303 and an opaque electrode 301, thereby forming an EL layer 305 comprising the light-emitting layer 303 and the buffer layers 302 and 304. Note that a gas space 307, spacers 308, and a cover material 309 are similar to the gas space 104, the spacers 106, and the cover material 105 in FIG. 1, respectively.

Embodiment 1

Figure 4:
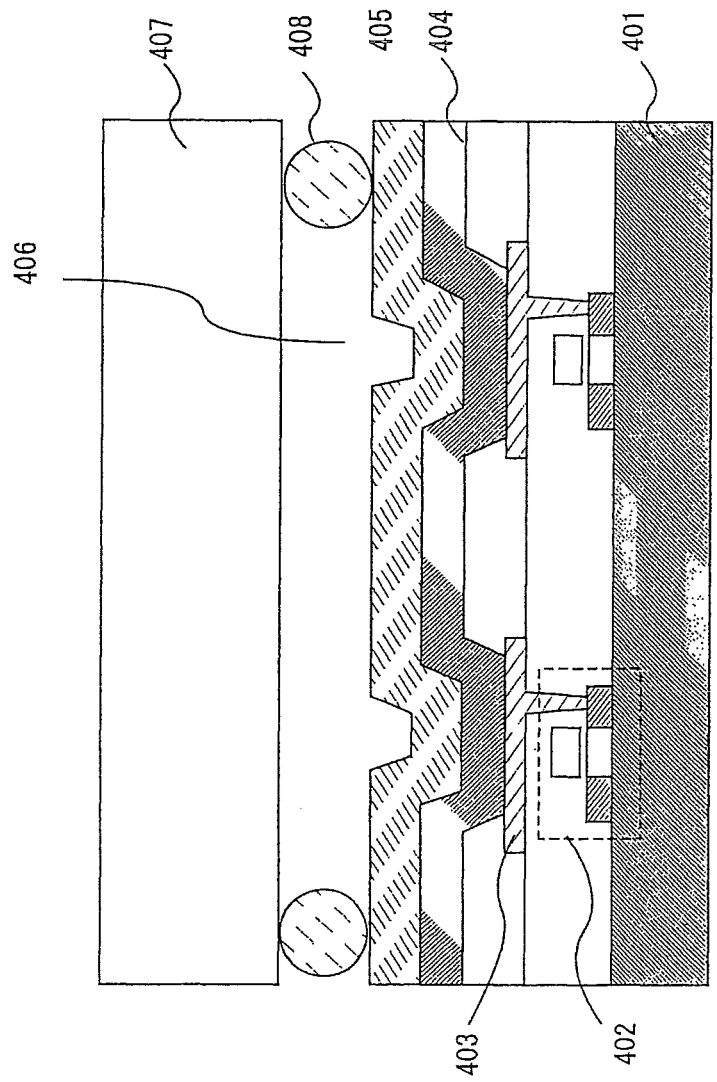
FIG. 4 is a diagram showing a structure of a self light-emitting device of the present invention.

FIG. 4 is a diagram showing the cross sectional structure of an active matrix type self light-emitting device of the present invention. In FIG. 4, reference numeral 401 denotes a substrate and 402 denotes a TFT. It is to be noted that a known TFT is used as the TFT 402. Furthermore, reference numeral 403 denotes an electrode having aluminum (AL) as its principal constituent, and a polyparaphenylene vinylene (PPV) is used for an EL layer 404. Reference numeral 405 denotes a transparent electrode made of ITO, and argon is filled in a gas space denoted by 406. Also, glass is used as a cover material 407 and spacers 408 are utilized in the gas space 406 to secure it.

Embodiment 2

Figure 5:
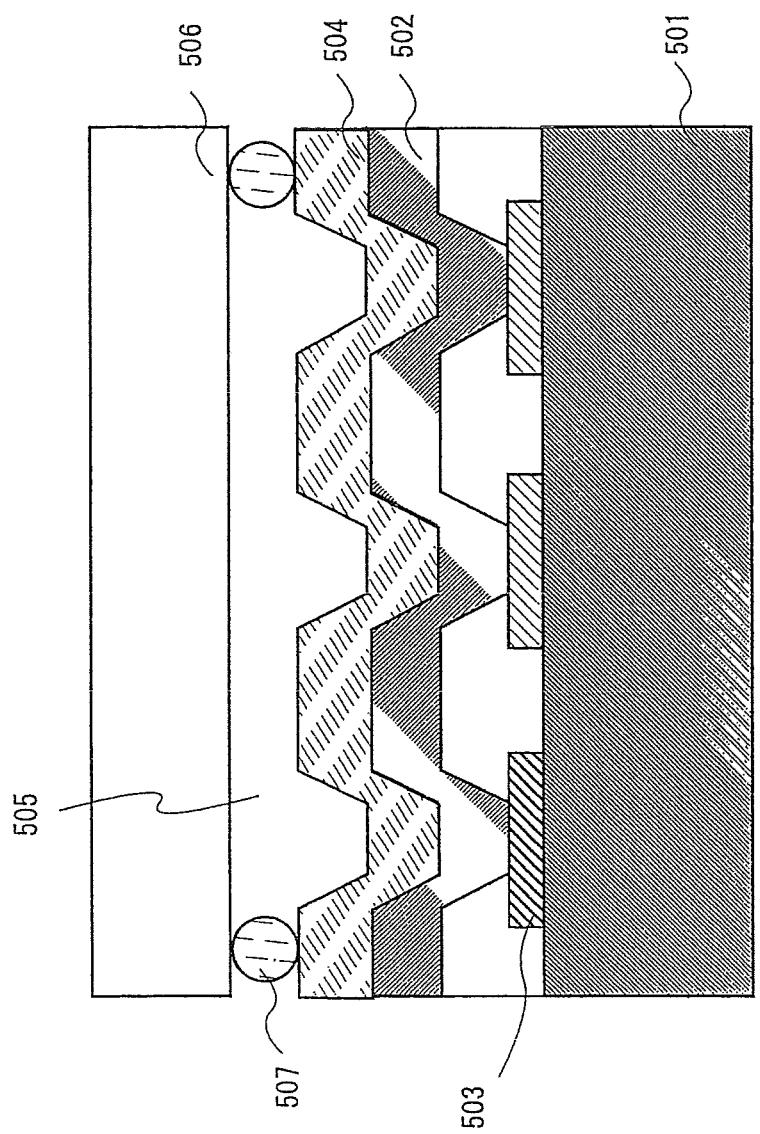
FIG. 5 is a diagram showing a structure of a self light-emitting device of the present invention.

FIG. 5 is a diagram showing a cross sectional structure of a passive matrix type self light-emitting device of the present invention. In FIG. 5, reference numeral 501 denotes a substrate and 502 denotes an EL layer. PPV is used for the EL layer. Reference numeral 503 denotes a plurality of opaque electrodes (cathodes) arranged in stripe shapes and a plurality of transparent electrodes (anodes) 504 are provided in stripe shapes so as to be orthogonal to the plurality of opaque electrodes 503.

In addition, the EL layer 502 is fowled sandwiched between the plurality of opaque electrodes 503 and the plurality of transparent electrodes 504. At this point, a cover material 506 made of glass is provided on the plurality of transparent electrodes 504, sandwiching spacers 507. A gas space 505 is thus formed between the cover material 506 and the plurality of electrodes 504. Nitrogen is filled in the gas space 505 in Embodiment 2. Note that the constitution of Embodiment 2 may be implemented by freely combining it with the constitution of Embodiment 1.

Embodiment 3

As shown in FIG. 3, the EL layer 305 comprises the light-emitting layer 303 and, as buffer layers, the electron injection layer 302 and the hole injection layer 304. A polymer-based material is used for the layers constituting the El layer 305. For example, polyparaphenylene vinylene can be used for the light-emitting layer 303, copper pthalocyanine or PEDOT for the buffer layer (hole injection layer) 304, and lithium fluoride or lithium for the buffer layer (electron injection layer) 302.

Note that in forming the EL layer 305, it is desirable that the treatment atmosphere for conducting the formation of this layer is a dry atmosphere having as little moisture as possible and in inert gas. The inert gas here is one such as nitrogen or argon. Because the EL layer easily deteriorates due to the presence of moisture or oxygen, it is therefore necessary to eliminate these factors as much as possible when forming this layer. In addition, these layers which constitute the EL layer 305 may be provided commonly for all the pixels, and therefore they may be formed by employing the spin coating method or the printing method.

The electron injection layer 302, which is the buffer layer, has a role to inject electrons from the cathode 301 to the light-emitting layer 303, and the hole injection layer 304 has a role to inject holes from the transparent electrode (anode) 306 to the light-emitting layer 303. In addition, by providing the hole injection layer 304, the prevention of damages to the light-emitting layer 303 during the formation of the electrodes can be expected. Note that the constitution of Embodiment 3 may be implemented by freely combining it with the constitution of Embodiments 1 or 2.

Embodiment 4

In manufacturing the EL element, a tris (8-quinolinolate) aluminum complex ($Alq_3$) is used for the light-emitting layer, and when using magnesium and silver (MgAg) for the cathode, the evaporated complexes of both the $Alq_3$ and the acetylacet sodium complexes can be used as the buffer layer sandwiched between the light-emitting layer and the cathode.

Note that the constitution of Embodiment 4 may be implemented by freely combining it with any of the constitutions of Embodiments 1 to 3.

Embodiment 5

A self light-emitting device having a structure in which an organic EL material is used as a light-emitting layer sandwiched between a cathode and an anode has excellent brightness as well as low power consumption, and hence may be utilized as aback light of a liquid crystal display device, etc. Regarding the cathode, the anode, and the light-emitting layer, each can be formed on the entire surface of the substrate provided that the cathode and the anode are formed in a range that they do not directly contact each other. Furthermore, materials such as PPV and PVK (polyvinyl carabazole) may be used as the organic EL material. The present invention may be employed as the back light of a liquid crystal display utilized in the display portion of a mobile phone, the monitor of a personal computer (PC), and the like. Note that the constitution of Embodiment 5 may be implemented by freely combining it with any of the constitutions of Embodiments 1 to 4.

What is claimed is:

1. A light-emitting device comprising:
   an EL layer interposed between a first electrode and a second electrode;
   a member covering an edge portion of the second electrode and covered by the EL layer;
   a cover material; and
   a spacer between the first electrode and the cover material, wherein:
   the EL layer comprises a light-emitting layer, an electron-injection layer, and a hole-injection layer;
   a space is located between the first electrode and the cover material;
   the light-emitting device is arranged so that light emitted from the EL layer is extracted through the space and the cover material; and
   the following relation is established:

$d \leq \lambda/(4n)$ where d is a thickness of each of the layers in the EL layer, $\lambda$ is a wavelength of the light, and n is an refractive index of the EL layer.

2. The light-emitting device according to claim 1, wherein:
   the cover material comprises glass, quartz, or plastic; and
   the spacer is in contact with the first electrode and the cover material.

3. The light-emitting device according to claim 1, wherein the spacer and the second electrode do not overlap with each other.

4. The light-emitting device according to claim 1, wherein an inert gas is included in the spacer.

5. The light-emitting device according to claim 1, wherein the first electrode and the second electrode are an anode and a cathode, respectively.

6. The light-emitting device according to claim 1, wherein the second electrode includes aluminum as a main component.

7. The light-emitting device according to claim 1, further comprising a thin film transistor,
   wherein the second electrode is electrically connected to the thin film transistor.

8. The light-emitting device according to claim 1, wherein the member has a taper shape in a region which overlaps with the second electrode.

* * * * *